(12) United States Patent
Saito et al.

(10) Patent No.: US 6,933,544 B2
(45) Date of Patent: Aug. 23, 2005

(54) POWER SEMICONDUCTOR DEVICE (75) Inventors: Wataru Saito, Kawasaki (JP); Ichiro Omura, Yokohama (JP); Hiromichi Ohashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/967,166

(22) Filed: Oct. 19, 2004

(65) Prior Publication Data
US 2005/0110042 A1 May 26, 2005

Related U.S. Application Data (63) Continuation of application No. PCT/JP03/00843, filed on Jan. 29, 2003.

(51) Int. Cl.[7] ............................................. H01L 29/739
(52) U.S. Cl. ...................... 257/194; 257/192; 438/285; 438/590
(58) Field of Search ............................... 257/194, 192; 438/285, 590

(56) References Cited

U.S. PATENT DOCUMENTS

| 6,100,571 A | 8/2000 | Mizuta et al. |
| 6,555,851 B2 | 4/2003 | Morizuka |

FOREIGN PATENT DOCUMENTS

| JP | 5-21793 | 1/1993 |
| JP | 11-261053 | 9/1999 |
| JP | 2000-315804 | 11/2000 |
| JP | 2001-230263 | 8/2001 |
| JP | 3271613 | 1/2002 |
| JP | 2002-299625 | 10/2002 |

OTHER PUBLICATIONS

Li, J., et al., "High breakdown voltage GaN HFET with field plate", Electronics Letters, vol. 37, No. 3, Feb. 1, 2001, pp. 196-197.
Karmalkar, Shereepad, et al., "Resurf AlGaN/GaN HEMT for High Voltage Power Switching", IEEE Electron Device Letters, vol. 22, No. 8, Aug. 2001, pp. 373-375.
Simin, Grigory, et al., "SiO2/AlGaN/InGaN/GaN MOSDHFETS", IEEE Electron Device Letters, vol. 23, No. 8, Aug. 20002, pp. 458-460.
Coffie, R., et al., p-Capped GaN-AlGaN-GaN High-Electron Mobility Transistors (HEMTs), IEEE Electron Device Letters, vol. 23, No. 10, Oct. 2002, pp. 588-590.

*Primary Examiner*—Eddie Lee
*Assistant Examiner*—Douglas W. Owens
(74) *Attorney, Agent, or Firm*—Oblon, Spivak, McClelland, Maier & Neustadt, P.C.

(57) ABSTRACT

A power semiconductor device including a non-doped GaN channel layer, an n-type $Al_{0.2}Ga_{0.8}N$ barrier layer formed on the channel layer, a p-type $Al_{0.1}Ga_{0.9}N$ semiconductor layer selectively formed on the barrier layer, a drain electrode positioned at one of both sides of the semiconductor layer and formed on the barrier layer, an insulating film formed on the barrier layer adjacent to the semiconductor layer between at least semiconductor layer and drain electrode, and a field plate electrode formed on the insulating film.

17 Claims, 9 Drawing Sheets

POWER SEMICONDUCTOR DEVICE

CROSS-REFERENCE TO RELATED APPLICATIONS

This is a Continuation Application of PCT Application No. PCT/JP03/00843, filed Jan. 29, 2003, which was published under PCT Article 21(2) in English.

BACKGROUND OF THE INVENTION

1. Field of the Invention

The present invention relates to a power semiconductor device used for power control. In particular, the present invention relates to a lateral type power FET using nitride semiconductor, a Schottky Barrier Diode (SBD) and the like.

2. Description of the Related Art

Power semiconductor devices such as switching device and diode are used for power control circuits such as switching mode power supply and inverter circuit. The power semiconductor device requires the following characteristics, that is, high breakdown voltage and low ON resistance. There exists a trade-off relationship determined by device material between breakdown voltage and ON resistance in the power semiconductor device. According to recent technical advance, the low ON resistance close to the limitations of the principal device material, that is, silicon is realized in the power semiconductor device. In order to further reduce the ON resistance, the device material needs to be changed. Such as GaN and AlGaN nitride semiconductors or silicon carbide (SiC), wide band gap semiconductors are used as switching device material. By doing so, it is possible to improve the trade-off relationship determined by the above materials, and to achieve low ON resistance. A HEMT (High Electron Mobility Transistor) using nitride semiconductors such as GaN and AlGaN has been disclosed in the document below. The document is R. Coffie et al, "p-Capped GaN—AlGaN—GaN High Electron Mobility Transistors (HEMTs)", IEEE ELECTRON DEVICE LETTERS, VOL. 23, No. 10. OCTOBER 2002, page 598-590.

Recently, the study of the power semiconductor device using the wide band gap semiconductor has been frequently made. In the nitride semiconductor such as GaN, low ON resistance has been realized. However, design has not been made taking characteristics peculiar to the power device, that is, avalanche withstand capability into consideration. This is because GaN-based device is designed based on radio frequency (RF) device.

Incidentally, in FETs, a field plate electrode is provided, and thereby, high breakdown voltage is achieved. The above technique has been disclosed in JPN. PAT. APPLN. KOKAI Publication Nos. 5-21793 and example.

BRIEF SUMMARY OF THE INVENTION

An object of the present invention is to provide a power semiconductor device, which has high avalanche withstand capability and ultra-low ON resistance.

According to an aspect of the present invention, there is provided a power semiconductor device comprises:

a first semiconductor layer of non-doped $Al_XGa_{1-X}N$ ($0 \leq X \leq 1$);

a second semiconductor layer of non-doped or n-type $Al_YGa_{1-Y}N$ ($0 \leq Y \leq 1$, $X<Y$) formed on one surface of the first semiconductor layer;

a third semiconductor layer of p-type $Al_ZGa_{1-Z}N$ ($0 \leq Z \leq 1$) selectively formed on the second semiconductor layer;

a first electrode positioned at one of both sides of the third semiconductor layer, and formed on the second semiconductor layer;

an insulating film formed on the second semiconductor layer adjacent to the third semiconductor layer between at least third semiconductor layer and the first electrode; and a field plate electrode formed on the insulating film.

The power semiconductor device of the present invention generates two-dimensional electron gas having high mobility by combining AlGaN-based hetero-junction structure, and uses the electron gas thus generated as a carrier when current is carried, and thereby, low ON resistance can be realized. The nitride semiconductor having wide band gap is used, and field plate structure is employed, and thereby, high breakdown voltage can be realized. In addition, the p-type AlGaN layer is formed on the surface of the semiconductor layer, and thereby, it is possible to speedily discharge holes when avalanche breakdown occurs; therefore, high avalanche withstand capability can be obtained. The point where avalanche breakdown occurs exists in the semiconductor, that is, on the p-n junction surface, and not the interface between semiconductor and passivation film such as the end of the field plate electrode. By doing so, it is possible to prevent interface un-stability by heat, and thus, to realize a device having high reliability.

DETAILED DESCRIPTION OF THE INVENTION

The embodiments of the present invention will be described below with reference to the accompanying drawings. The same reference numerals are given to the portions corresponding through all drawings.

First Embodiment

Figure 1:
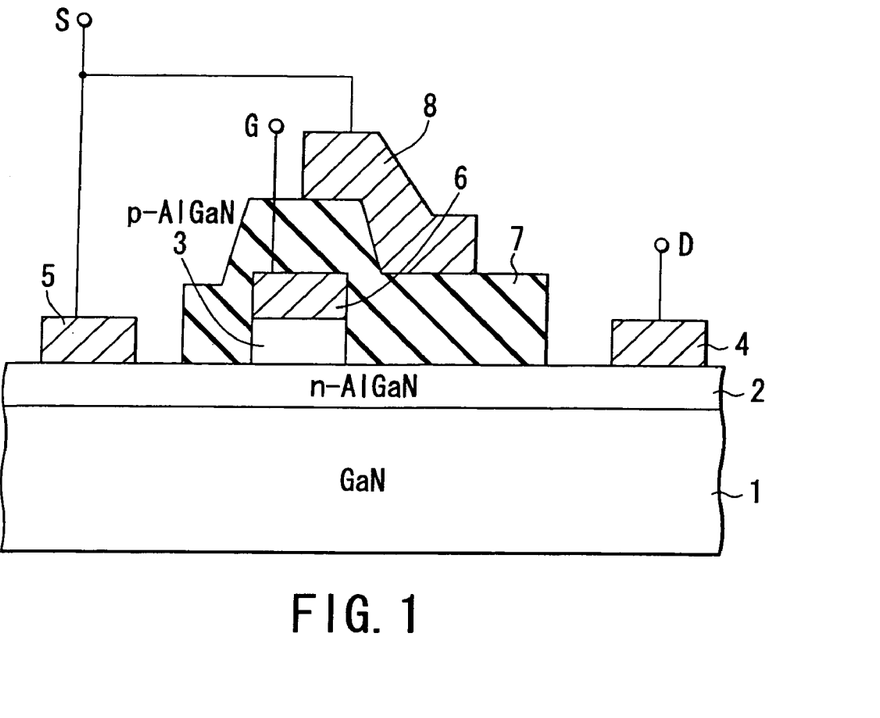
FIG. 1 is a cross-sectional view schematically showing a power semiconductor device according to a first embodiment of the present invention.

FIG. 1 is a cross-sectional view schematically showing the structure of a junction type power HEMT (High Electron Mobility Transistor) according to a first embodiment of the present invention.

The HEMT is provided with a channel layer 1 including a GaN layer (X=0) as non-dope $Al_XGa_{1-X}N$ ($0 \leq X \leq 1$). The thickness of the channel layer 1 is set to about 1 to 2 $\mu$m in order to obtain a breakdown voltage of 600 V. A barrier layer 2 is formed on the surface (one side) of the channel layer 1 as n-type $Al_YGa_{1-Y}N$ ($0 \leq Y \leq 1$, X<Y) with a thickness of 0.02 $\mu$m. The barrier layer 2 includes an $Al_{0.2}Ga_{0.8}N$ layer (Y=0.2) in which Si is doped as impurity by dosage of about $10^{13}$ (atom/cm$^2$). Further, a semiconductor layer 3 is selectively formed on the barrier layer 2 as p-type $Al_ZGa_{1-Z}N$ ($0 \leq Z \leq 1$) with a thickness of 0.01 $\mu$m. The semiconductor layer 3 includes an $Al_{0.1}Ga_{0.9}N$ layer (Z=0.1) in which Mg is doped as impurity.

A drain electrode (D: first electrode) 4 and a source electrode (S: second electrode) 5 consisting of Ti/Al/Ni/Au are formed separately from each other at both sides of the above semiconductor layer 3 on the barrier layer 2. The above drain and source electrodes 4 and 5 are electrically connected with the surface of the barrier layer 2, respectively.

A gate electrode (G: control electrode) 6 consisting of Pt or Ni/Au is formed on the semiconductor layer 3. The gate electrode 6 is electrically connected with the surface of the semiconductor layer 3.

An insulating film 7 is formed so as to continuously cover the above gate electrode 6 and the surrounding barrier layer 2. A field plate electrode 8 consisting of Ti/Al/Ni/Au is formed on the insulating film 7 so that it can be positioned between the gate electrode 6 and the drain electrode 4. The field plate electrode 8 electrically connected with the source electrode 5.

The HEMT having the structure described above operates as a junction type FET in which the depth of a depletion layer formed in the surface region of the channel layer 1 is controlled in accordance with the voltage applied to the gate electrode 6. Thus, a current flowing between the source and drain electrode 5 and 4 is controlled in accordance with the depth of the depletion layer.

In the HEMT of the first embodiment, nitride semiconductors such as $Al_XGa_{1-X}N$, $Al_YGa_{1-Y}N$ and $Al_ZGa_{1-Z}N$ having wide band gap are used as device material. Therefore, critical field is enhanced, so that high breakdown voltage of the device can be realized. The field plate electrode 8 is formed between the gate determining the breakdown voltage and the drain. Thus, when a voltage is applied, an electric field applied between the gate electrode 6 and the drain electrode 4 is relived, so that the step-down of breakdown voltage can be prevented. Two-dimensional electron gas having high mobility is generated in an AlGaN/GaN hetero-interface including the barrier layer 2 and the channel layer 1; therefore, low ON resistance can be realized.

The p-type semiconductor layer 3 is further formed on the n-type barrier layer 2. Therefore, if avalanche breakdown occurs in the device, generated holes speedily move into the p-type semiconductor layer 3, and thereby, high avalanche withstand capability is realized.

In addition, the p-type semiconductor layer 3 is formed on the barrier layer 2; therefore, the following effect is obtained; namely, a gate leak current is reduced.

In the normal HEMT structure, the breakdown voltage is determined by an electric field generated in the Schottky junction of the gate. On the contrary, in the above HEMT structure of the above embodiment, an electric field generated in the p-n junction between the p-type semiconductor layer 3 and the n-type barrier layer determines the above breakdown voltage. In other words, in comparison with the structure that characteristic non-uniformity of the Schottky junction device is easy to become great, the breakdown point exists in the semiconductor layer. Therefore, the following effect; namely, non-uniformity of breakdown voltage is prevented.

Further, in the normal HEMT structure, high electric field is generated in a gate Schottky interface, field plate end, metal interface between a semiconductor and a passivation film, etc. For this reason, if a design is made such that avalanche breakdown occurs in the above points, characteristic variations by heat are easy to occur. On the contrary, in the HEMT structure of the above embodiment, the breakdown point exists in the pn junction of the semiconductor layer. Therefore, the stability of avalanche breakdown increases, so that a device having high reliability can be realized.

The field plate electrode 8 is connected with the source electrode 5, and thereby, gate/drain capacitance between becomes small; therefore, high-speed switching operation can be realized.

The semiconductor layer 3 including the p-type $Al_{0.1}Ga_{0.9}N$ layer is uniformly formed by crystal growth together with the channel layer 1 and the barrier layer 2. Thereafter, the semiconductor layer 3 may be patterned and formed by etching. Further, the semiconductor layer 3 is formed by crystal growth, thereafter, may be formed by selective oxidation process. Furthermore, the channel layer 1 and the barrier layer 2 are formed by crystal growth; thereafter; the semiconductor layer 3 may be formed on the surface of their layers by selective growth.

First Modification Example of First Embodiment

Figure 2:
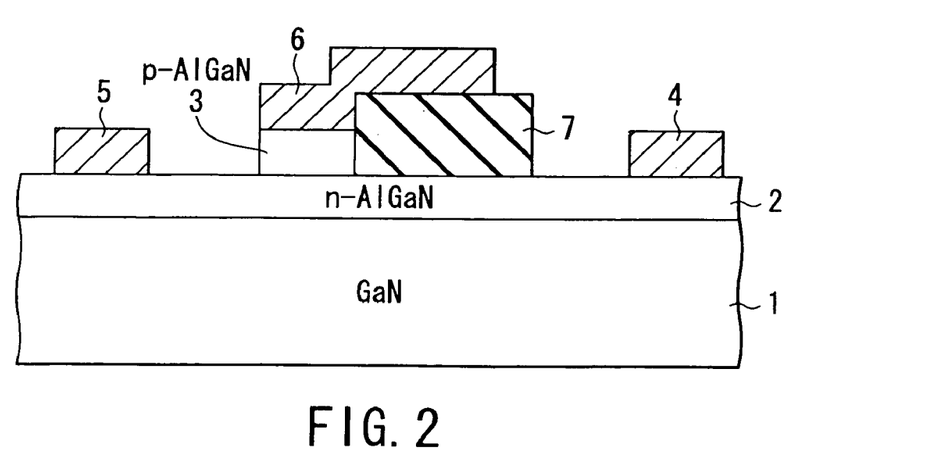
FIG. 2 is a cross-sectional view schematically showing a power semiconductor device according to a first modification example of the first embodiment.

FIG. 2 is a cross-sectional view schematically showing the structure of the power HEMT shown in FIG. 1 according to a first modification example. In the power HEMT shown in FIG. 1, the dielectric layer 7 is formed so as to continuously cover the gate electrode 6 and the surrounding barrier layer 2, and the field plate electrode 8 is electrically connected to the source electrode 5.

On the contrary, the power HEMT of FIG. 2 has the following structure. That is, the dielectric layer 7 is formed so that it can be positioned between the semiconductor layer 3 and the drain electrode 4 and is adjacent to the semiconductor layer 3. The gate electrode 6 is formed so as to extend to the dielectric layer 7 in addition to the upper surface of the semiconductor layer 3. In other words, according to the first modification example, the gate electrode 6 functions concurrently as the field plate electrode 8 shown in FIG. 1.

The power HEMT of the modification example can obtain the same effects as FIG. 1, in addition, the field plate electrode and the gate electrode can be formed together. Therefore, the following effect is obtained; that is, manufacture process can be simplified as compared with FIG. 1.

Second Modification Example of First Embodiment

Figure 3:
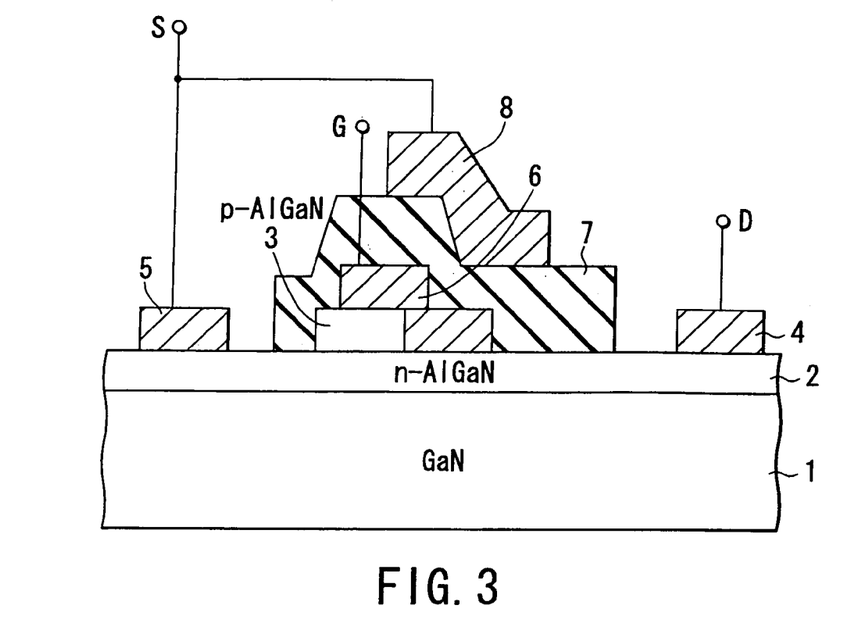
FIG. 3 is a cross-sectional view schematically showing a power semiconductor device according to a second modification example of the first embodiment.

FIG. 3 is a cross-sectional view schematically showing the structure of the power HEMT shown in FIG. 1 according to a second modification example. The power HEMT of FIG. 3 differs from that of FIG. 1 in that the gate electrode 6 is formed so as to extend to the surface of the barrier layer 2 adjacent to the side of the drain electrode 4 of the semiconductor layer 3.

Namely, in the power HEMT of FIG. 3, the gate electrode 6 forms Schottky junction with the barrier layer 2.

According to the second modification example, the gate electrode 6 makes Schottky connection with the barrier layer 2. However, since the semiconductor layer 3 is connected with the gate electrode 6, holes are discharged via the semiconductor layer 3 in avalanche breakdown; therefore, high avalanche withstand capability is realized like the case of FIG. 1. Beside, the same effect as the case of FIG. 1 is obtained.

Third Modification Example of First Embodiment

Figure 4:
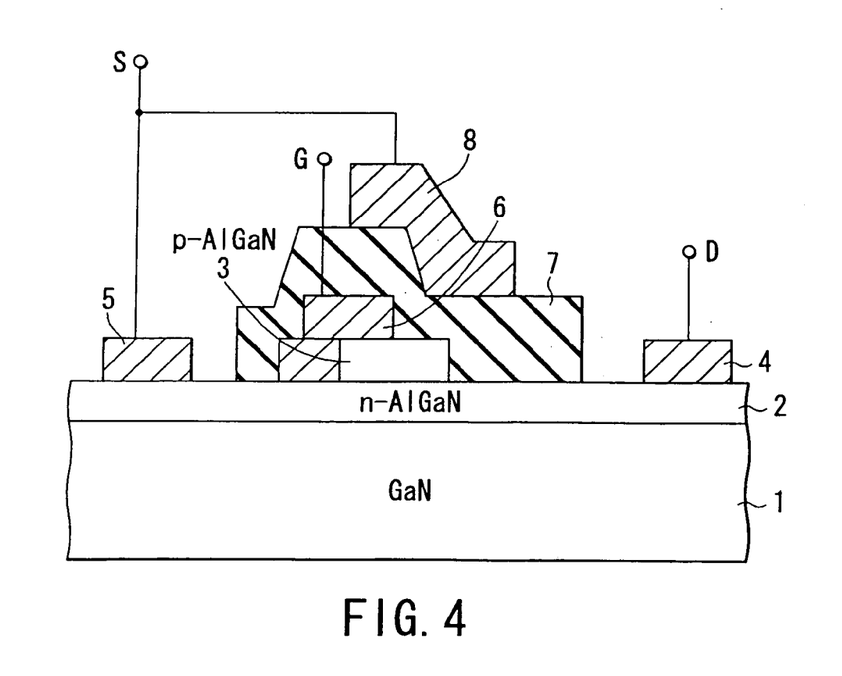
FIG. 4 is a cross-sectional view schematically showing a power semiconductor device according to a third modification example of the first embodiment.

FIG. 4 is a cross-sectional view schematically showing the structure of the power HEMT shown in FIG. 1 according to a third modification example. In the power HEMT of FIG. 3, the gate electrode 6 is formed so as to extend to the surface of the barrier layer 2 adjacent to the side of the drain electrode 4 of the semiconductor layer 3. On the contrary, in the power HEMT of FIG. 4, the gate electrode 6 is formed so as to extend to the surface of the barrier layer 2 adjacent to the source electrode 5 of the semiconductor layer 3.

According to the third modification example, the gate electrode 6 makes Schottky connection with the barrier layer 2. However, since the semiconductor layer 3 is connected with the gate electrode 6, holes are discharged via the semiconductor layer 3 in avalanche breakdown; therefore, high avalanche withstand capability is realized like the case of FIG. 1. Beside, the same effect as the case of FIG. 1 is obtained.

Second Embodiment

Figure 5:
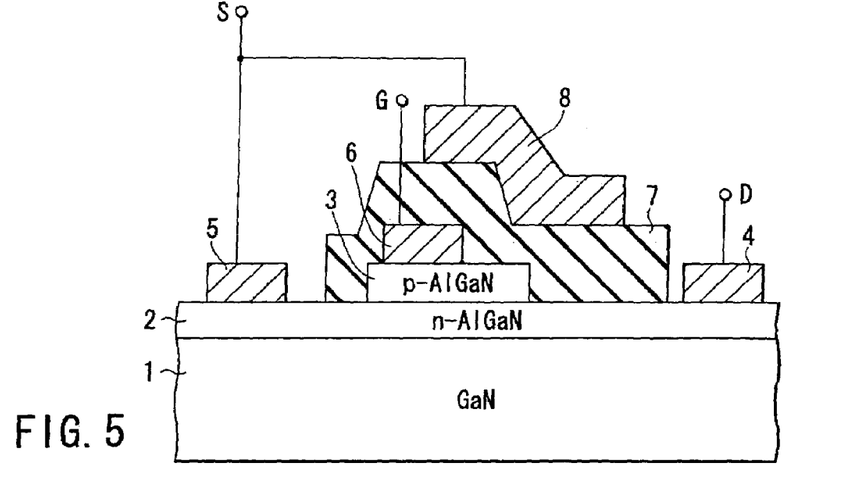
FIG. 5 is a cross-sectional view schematically showing a power semiconductor device according to a second embodiment of the present invention.

FIG. 5 is a cross-sectional view schematically showing the structure of a junction type power HEMT according to a second embodiment of the present invention. In the power HEMT of FIG. 1, the semiconductor layer 3 including the p-AlGaN layer is formed into the same length as the gate electrode 6. Namely, the end of the semiconductor layer 3 on the side of the drain electrode 4 is aligned in position with the end of the gate electrode 6 on the side of the same.

On the contrary, in the power HEMT of the second embodiment, the semiconductor layer 3 including the p-AlGaN layer is formed so that the end on the side of the drain electrode 4 can be extended from the end of the gate electrode 6 on the side of the drain electrode 4 toward the side of the drain electrode 4. Further, the semiconductor layer 3 is formed so that the end on the side of the drain electrode 4 can be positioned below the field plate electrode 8.

Figure 6A:
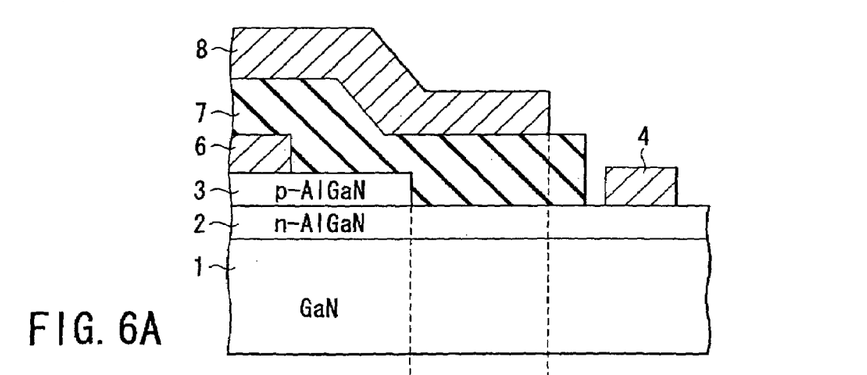
FIG. 6A and FIG. 6B are a cross-sectional view and a characteristic diagram respectively to explain the above second embodiment.
Figure 6B:
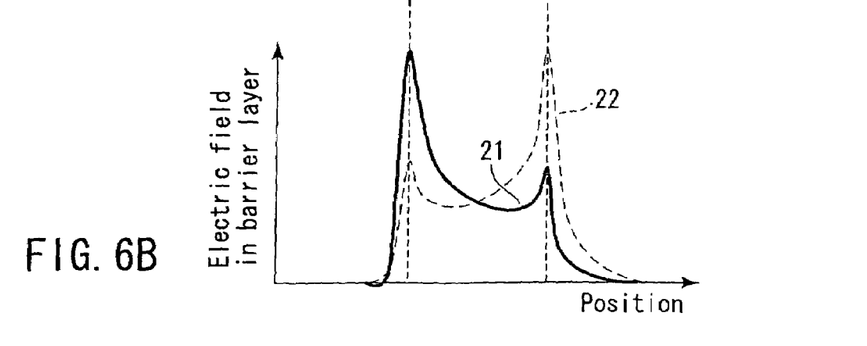

FIG. 6A is a cross-sectional view enlarging the end portion of the semiconductor layer 3 of the power HEMT of FIG. 5, and FIG. 6B is a characteristic diagram showing electric field distribution in the barrier layer 2 when the power HEMT of FIG. 5 is operated.

As shown in FIG. 5, the semiconductor layer 3 is formed so that the end on the side of the drain electrode 4 can be positioned below the field plate electrode 8. By doing so, as seen from FIG. 6B, the field concentrated points exist in the end of the semiconductor layer 3 and the end of field plate electrode 8. In FIG. 6B, the characteristic curve (line) 21 shows the case where the insulating film 7 is formed thick in some degree; on the other hand, the characteristic curve 22 shows the case where the insulating film 7 is formed thin in some degree.

More specifically, the dielectric layer 7 under the field plate electrode 8 is formed so as to have a proper thickness, and thereby, the point where avalanche breakdown occurs, that is, the electric field becomes highest, is set to the end of the semiconductor layer 3. Therefore, holes are speedily discharged in avalanche breakdown, so that sufficient avalanche withstand capability can be secured.

Figure 7A:
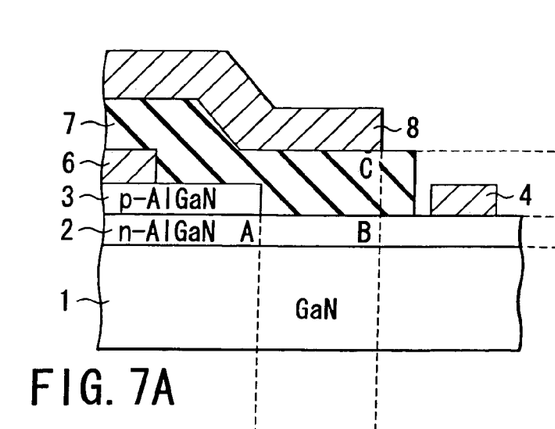
FIG. 7A to FIG. 7C are a cross-sectional view and a characteristic diagram respectively to explain the above second embodiment.
Figure 7B:
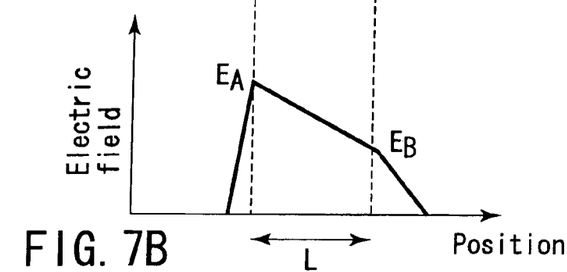
Figure 7C:
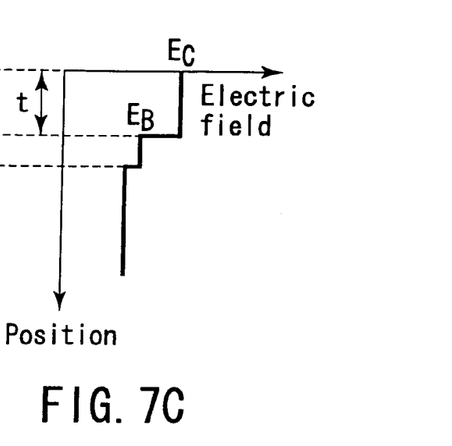

The following is a description on a method of setting the thickness of the insulating film 7 so that the electric field becomes highest at the end of the semiconductor layer 3. FIG. 7A is a cross-sectional view enlarging the end portion of the semiconductor layer 3 of the power HEMT shown in FIG. 5. FIG. 7B is a characteristic diagram showing an electric field distribution in the horizontal direction when the power HEMT of FIG. 5 is operated. FIG. 7C is characteristic diagram showing an electric field distribution in the vertical direction when the power HEMT of FIG. 5 is operated. In FIG. 7B and FIG. 7C, the point of the end of the semiconductor layer 3 on the side of drain electrode 4 is set as A, the point of the barrier layer 2 under the end of the field plate electrode 8 is set as B, and the point of the end of the field plate electrode 8 is set as C. The electric fields of above points A to C are set as $E_A$, $E_B$ and $E_C$, respectively. In addition, the distance from the point A to B, that is, the length of the field plate electrode 8 is set as L, and the thickness of the insulating film 7 is set as t.

Based on the magnitude of the electric field of each point and the dimension of each element, a voltage $V_{AB}$ between the points A and B and a voltage $V_{CB}$ between the points C and B are expressed by the following equations (1) and (2), respectively.

$$V_{AB} = (E_A + E_B)L/2 \tag{1}$$

$$V_{CB} = E_C t \tag{2}$$

The potential of the field plate electrode 8 is approximately equal to that of the semiconductor layer 3; therefore, the voltage $V_{AB}$ is equal to the voltage $V_{CB}$. Since electric flux density continues, the relationship between the electric fields $E_B$ and $E_C$ is expressed by the following equation (3).

$$\epsilon_i E_C = \epsilon_s E_B \tag{3}$$

Where, $\epsilon_i$ is dielectric constant (relative permittivity) of the dielectric layer 7, and $\epsilon_S$ is dielectric constant of the barrier layer 2. The above equations (1) to (3) are modified so that the relationship between the electric fields $E_A$ and $E_B$ can be determined. The above relationship is expressed by the following equation (4).

$$E_A/E_B = 2\epsilon_S t/\epsilon_i L - 1 \quad (4)$$

In this case, the electric field $E_A$ is set larger than the electric filed $E_B$, and thereby, the avalanche withstand capability becomes large. Thus, the ratio of $E_A$ to $E_B$ expressed by the equation (4) is set larger than 1. Based on the above matter, when modifying the equation (4), the following equation (5) is obtained.

$$\epsilon_S t > \epsilon_i L \quad (5)$$

Therefore, it is desirable to set the thickness t of the insulating film 7 and the length L of the field plate electrode so that the relationship expressed by the above equation (5) can be satisfied.

If the length L of the field plate electrode is set to 2 μm, the insulating film 7 consists of $SiO_2$, and the composition ratio of the barrier layer 2 including the AlGaN layer is set to 0.2, the dielectric constants $\epsilon_i$ and $\epsilon_S$ are 3.9 and 9.3, respectively. Therefore, it is desirable that the thickness t of the insulating film 7 is set to 0.83 μm or more.

In wide band gap semiconductors such as AlGaN and GaN, the critical field is close to a dielectric breakdown field of the insulating film. If the dielectric breakdown voltage of the insulating film 7 is smaller than the avalanche breakdown voltage, the dielectric breakdown voltage determines the device breakdown voltage. In this case, if the voltage equivalent to the device breakdown voltage is applied to the device, the device is broken down. If the critical field of the semiconductor layer is equal to the dielectric breakdown field of the insulating film, the electric field $E_C$ of the point C shown in FIG. 7C is made smaller than the electric field $E_A$ of the point A shown in FIG. 7B. By doing so, it is possible to avoid dielectric breakdown.

When the above equations (1) to (3) are modified so that the relationship between $E_A$ and $E_C$ can be determined, the above relationship is expressed by the following equation (6).

$$E_A/E_C = 2t/L - \epsilon_i/\epsilon_S \quad (6)$$

The ratio expressed by the above equation (6) becomes larger than 1, and thereby, it is possible to avoid dielectric breakdown. Therefore, it is desirable to set the thickness t of the insulating film 7 and the length L of the field plate electrode so that the following equation (7) can be satisfied.

$$2t/L > (1 + \epsilon_i/\epsilon_S) \quad (7)$$

Likewise, if the length L of the field plate electrode is set to 2 μm, the insulating film 7 consists of $SiO_2$, and the composition ratio of the barrier layer 2 comprising the AlGaN layer is set to 0.2, the dielectric constants $\epsilon_i$ and $\epsilon_S$ are 3.9 and 9.3, respectively. Therefore, it is desirable that the thickness t of the insulating film 7 is set to 1.4 μm or more.

Third Embodiment

Figure 8:
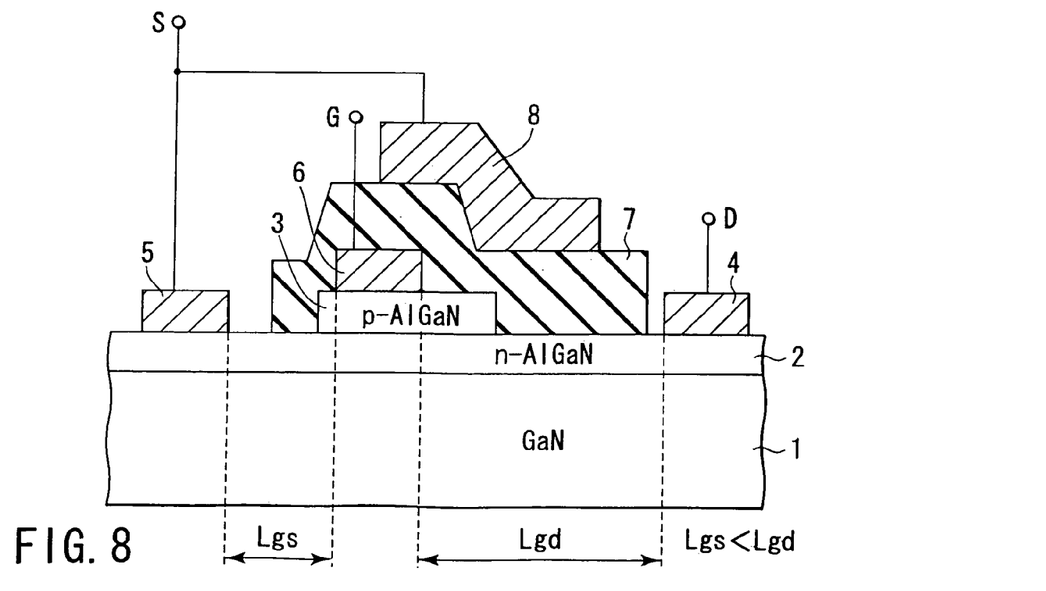
FIG. 8 is a cross-sectional view schematically showing a power semiconductor device according to a third embodiment of the present invention.

FIG. 8 is a cross-sectional view schematically showing the structure of a junction type power HEMT according to a third embodiment of the present invention. The distance between gate and drain determines the breakdown voltage of the lateral type power device shown in FIG. 1; therefore, it is desirable to make long the above distance. In addition, the distance between source and gate having no relation with the breakdown voltage is shortened. This contributes for reducing ON resistance. In the power HEMT of the third embodiment, the distance between gate and drain is set wider than the distance between gate and source in order to achieve high breakdown voltage and low ON resistance. More specifically, a distance Lgd is set wider than a distance Lgs. That is, the distance Lgd is a length between the end of the gate electrode 6 on the side of the drain electrode 4 and the end of the drain electrode 4 on the side of the gate electrode 6. The distance Lgs is a length between the end of the gate electrode 6 on the side of the source electrode 5 and the end of the source electrode 5 on the side of the gate electrode 6.

FIG. 8 shows the case where the end of the semiconductor layer 3 on the side of the drain electrode 4 is positioned below the field plate electrode 8. However, the third embodiment is not limited to the above arrangement, and as shown in FIG. 1, the semiconductor layer 3 may be formed so that the end on the side of the drain electrode 4 can be aligned with the end of the gate electrode 6. As illustrated in FIG. 3 and FIG. 4, the gate electrode 6 may be formed so that it extends to the surface of the barrier layer 2 adjacent to the side of the drain electrode 4 of the semiconductor layer 3, or to the side of the source electrode 5 thereof.

Fourth Embodiment

Figure 9:
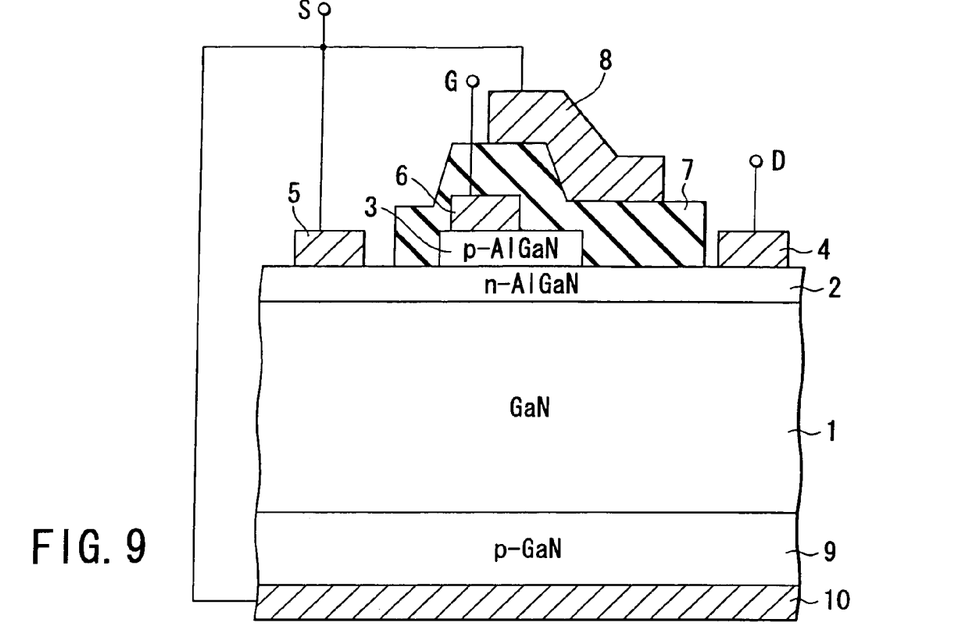
FIG. 9 is a cross-sectional view schematically showing a power semiconductor device according to a fourth embodiment of the present invention.

FIG. 9 is a cross-sectional view schematically showing the structure of a junction type power HEMT according to a fourth embodiment of the present invention. The Power HEMT shown in FIG. 9 differs from that of FIG. 1 in the following point. That is, a semiconductor layer 9 including a GaN layer (W=0) in which Mg is doped as impurity is formed on the back surface (the other side) of the channel layer 1 as p-type $Al_W Ga_{1-W}N$ ($0 \leq W \leq 1$). A back electrode 10 consisting of Pt is further formed on the surface of the semiconductor layer 3. In this case, the back electrode 10 is electrically connected with the source electrode 5.

In the power HEMT having the above structure, holes generated when avalanche breakdown occurs are discharged via the semiconductor layer 9 and the back electrode 10; therefore, it is possible to further enhance the avalanche withstand capability.

Modification Example of Fourth Embodiment

Figure 10:
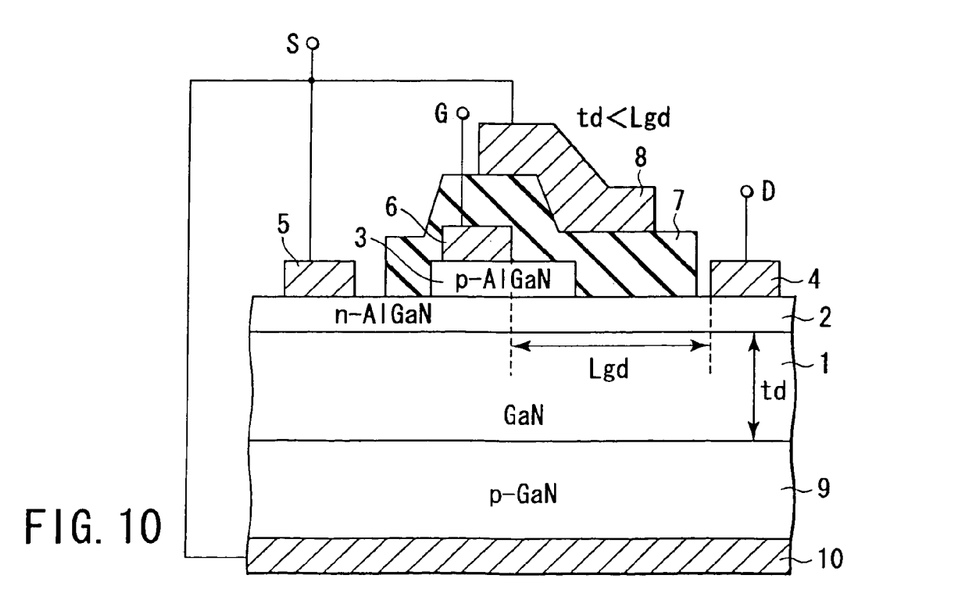
FIG. 10 is a cross-sectional view schematically showing a power semiconductor device according to a modification example of the fourth embodiment.

FIG. 10 is a cross-sectional view showing a modification example of the fourth embodiment. As seen from FIG. 10, a thickness td of the channel layer 1 is set smaller than the distance Lgd between the gate electrode 6 and the drain electrode 4. By doing so, avalanche breakdown is hard to occur at the junction between the channel layer 1 and the semiconductor layer 9; therefore, the thickness of the channel layer 1 determines the breakdown voltage. In this case, the thickness of the channel layer 1 is controlled in crystal growth; therefore, it is possible to manufacture a deice having almost no variations of breakdown voltage. The concentration of impurities contained in the semiconductor layer 9 is made high; therefore, holes are speedily discharged, and consequently, high avalanche withstand capability can be expected.

In the HEMT of the fourth embodiment and the modification example, contact formed on the back surface of the channel layer 1 with respect to the semiconductor layer 9 is taken out of the back surface of substrate. The contact with respect to the semiconductor layer 9 may be taken out of the same surface as the source electrode 5. In this case, no conductive substrate is required.

The p-type semiconductor layer 9 speedily discharges holes generated in the channel layer 1; therefore, it is desirable that the semiconductor layer 9 has a band gap same as or narrower than the channel layer 1. For this reason, it is desirable that a composition ratio W of the semiconductor layer 9 is the same as or smaller than a composition ratio X of the channel layer 1.

Fifth Embodiment

Figure 11:
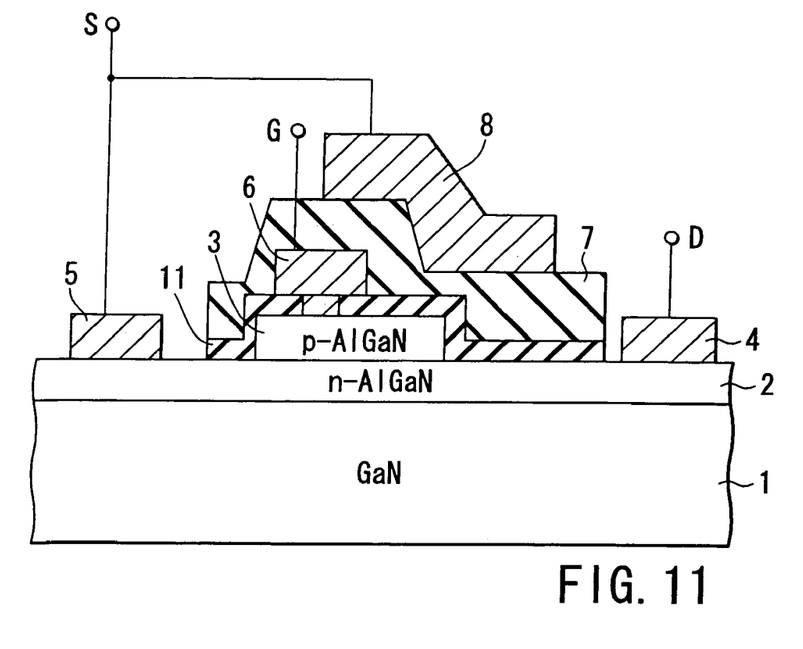
FIG. 11 is a cross-sectional view schematically showing a power semiconductor device according to a fifth embodiment of the present invention.

FIG. 11 is a cross-sectional view schematically showing the structure of a lateral type GaN-MISFET according to a fifth embodiment of the present invention.

In the MISFET of the fifth embodiment, a gate insulating film 11 is added to the HEMT shown in FIG. 5. More specifically, the gate insulating film 11 is formed so as to continuously cover the semiconductor layer 3 and the surrounding barrier layer 2. The gate electrode 6 is formed on the gate insulating film 11 positioned above the semiconductor layer 3. In this case, the gate insulating film 11 is partially formed with an opening portion so that the semiconductor layer 3 can be electrically connected with the gate electrode 6 via the opening portion.

In the MISFET having the above structure, the surface of the channel layer 1 is formed with an inverted channel in accordance with a voltage applied to the gate electrode 6. A current flowing between the source electrode 5 and the drain electrode 4 is controlled in accordance with the forming state of the inverted channel.

In the MISFET of the above embodiment, nitride semiconductors such as $Al_XGa_{1-X}N$, $Al_YGa_{1-Y}N$ and $Al_ZGa_{1-Z}N$ having wide band gap are used as device material. Thus, it is possible to improve a critical field, and to realize high breakdown voltage in devices. The field plate electrode 8 is formed between gate and drain determining the breakdown voltage. This serves to relieve the electric field applied between the gate electrode 6 and the drain electrode 4 when voltage is applied; therefore, it is possible to prevent the reduction of the breakdown voltage. Two-dimensional electron gas having high mobility is generated in the heterointerface between the barrier layer 2 and the channel layer; therefore, low ON resistance is realized.

The p-type semiconductor layer 3 is formed on the n-type barrier layer 2. Therefore, when avalanche breakdown occurs in the device, generated holes speedily move into the p-type semiconductor layer 3, and thereby, high avalanche effect can be obtained.

In addition, the p-type semiconductor layer 3 is formed on the barrier layer 2; therefore, the following effect can be obtained such that a gate leak current is reduced.

In the structure of the above embodiment, the electric field in the p-n junction between the p-type semiconductor layer 3 and the n-type barrier layer 2 determines the breakdown voltage. Since the breakdown point exists in the semiconductor layer, the following effect can be obtained such that non-uniformity of breakdown voltage is prevented.

In the structure of the above embodiment, the breakdown point exists in the p-n junction of the semiconductor layer. Therefore, avalanche breakdown stably increases, and a device having high reliability can be realized.

Since the field plate electrode 8 is connected with the source electrode 5, the capacitance between gate and drain becomes small; therefore, high-speed switching operation can be realized.

The semiconductor layer 3 is electrically connected with the gate electrode 6; therefore, the following effect can be obtained, that is, it is possible to make small a gate leak current.

First Modification Example of Fifth Embodiment

Figure 12:
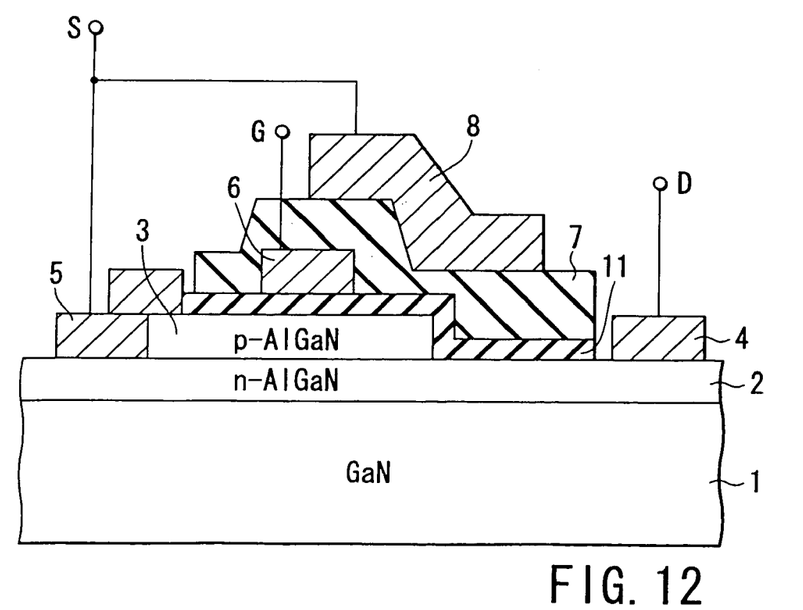
FIG. 12 is a cross-sectional view schematically showing a power semiconductor device according to a first modification example of the fifth embodiment.

FIG. 12 shows a MISFET according to a first modification example of the fifth embodiment. As seen from the MISFET shown in FIG. 12, the gate insulating film 11 may be formed with no opening portion so that the semiconductor layer 3 can be isolated from the gate electrode 6. The MISFET has the above-mentioned structure, and thereby, it is possible to extremely reduce a gate leak current.

In this case, the semiconductor layer 3 is not electrically connected with the gate electrode so that it becomes a potentially floating state, and thereby, holes are not discharged into the semiconductor layer 3. For this reason, in the MISFET of the modification example, the source electrode 5 is formed so that it can be partially extended to the upper portion of the semiconductor layer 3. By doing so, the semiconductor layer 3 is electrically connected with the source electrode 5. Therefore, avalanche current flows into the source electrode 5 via the semiconductor layer 3; however, it does not flow into the gate electrode 6. This serves to reduce a load to a gate drive circuit for driving the gate electrode 6.

Incidentally, it is desirable that interface state with the semiconductor layer 3 is small. For this reason, the following films are preferably used as the gate insulating film 11. The films include oxide films such as $Al_XGa_{2-X}O_3$ film oxidizing an AlGaN layer, insulating films such as $Al_2O_3$, SiN deposited by CVD process, etc.

If impurity concentration of the semiconductor layer 3 is too high, this is a factor of deteriorating the control characteristic of inverted channel generated by the voltage applied to the gate electrode. In other words, mutual conductance of the gate electrode 6 becomes small. Conversely, if the impurity concentration of the semiconductor layer 3 is too low, discharge resistance becomes large when discharging hole. Therefore, considering both viewpoints described above, it is desirable that the impurity concentration of the semiconductor layer 3 is set to the same as that of the barrier layer 2.

Second Modification Example of Fifth Embodiment

Figure 13A:
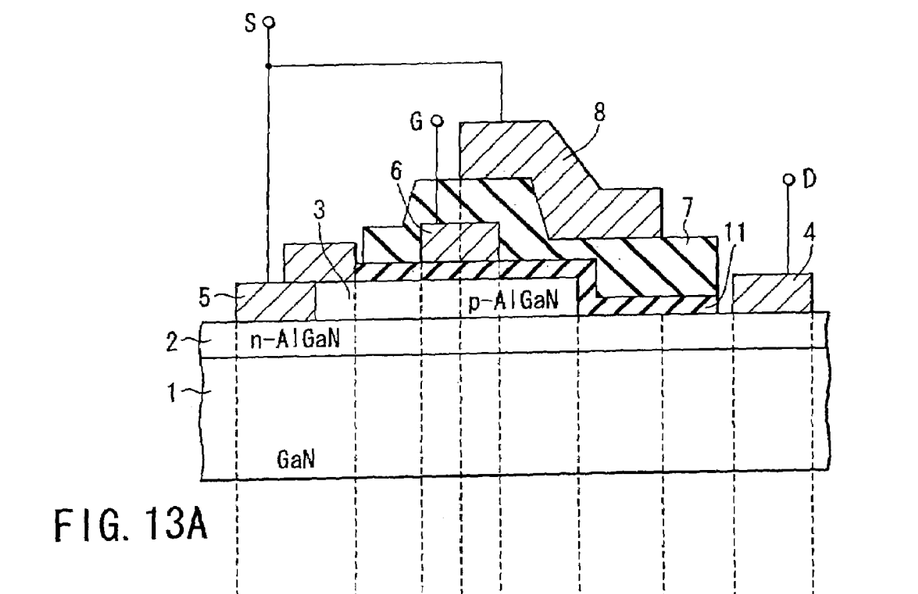
FIG. 13A and FIG. 13B are a cross-sectional view and a top plan view schematically showing a power semiconductor device according to a second modification example of the fifth embodiment.
Figure 13B:
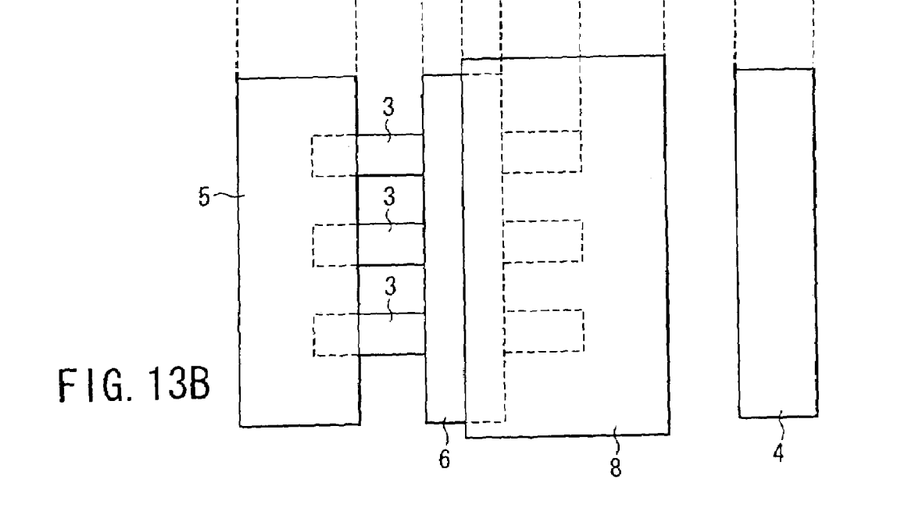

FIG. 13A and FIG. 13B are a cross-sectional view and a top plan view schematically showing the structure according to a second modification example of the power MISFET shown in FIG. 12. In the power MISFET shown in FIG. 12, the semiconductor layer 3 has been formed over the entire surface in the gate widthwise direction.

On the contrary, in the power MISFET shown in FIG. 13A and FIG. 13B, the semiconductor layer 3 is formed like a shape of rectangle in the gate widthwise direction. The semiconductor layer 3 has the above shape, and thereby, control of gate threshold voltage and ON resistance is possible.

The semiconductor layer 3 is formed into a shape of rectangle, and thereby, there are formed both portions where the semiconductor layer 3 is formed and is not formed under the gate. In the portion where the semiconductor layer 3 is formed, the gate threshold voltage is high, and in addition, channel resistance and offset resistance between gate and source are large. Conversely, in the portion where the semiconductor layer 3 is not formed under the gate, the gate threshold voltage is low, and in addition, channel resistance and offset resistance between gate and source are small.

In the whole of device, the former and latter portions are operated in parallel; therefore, the threshold voltage or ON resistance is controllable by changing the interval between rectangular-shaped semiconductor layers 3 and the density.

Sixth Embodiment

Figure 14:
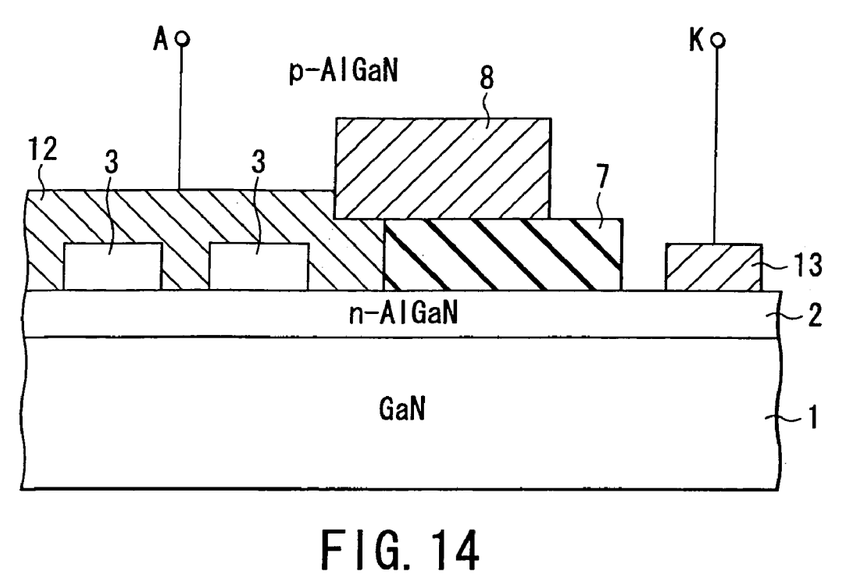
FIG. 14 is a cross-sectional view schematically showing a power semiconductor device according to a sixth embodiment of the present invention.

FIG. 14 is a cross-sectional view schematically showing the structure of a lateral type GaN-Schottky barrier diode (SBD) according to a sixth embodiment of the present invention.

The SBD is provided with the channel layer 1 including a non-doped GaN layer, like the FET shown in FIG. 1. The barrier layer 2 including the n-type $Al_{0.2}Ga_{0.8}N$ layer (Y=0.2) is formed on the surface of the channel layer 1. Further, a plurality of semiconductor layers 3 including the p-type $Al_{0.1}Ga_{0.9}N$ layer is selectively formed on the barrier layer 2.

An anode electrode (A: second electrode) 12 consisting of Ni/Au is formed so as to continuously cover the above semiconductor layers 3 and the surrounding barrier layer 2. The insulating film 7 is formed on the barrier layer 2 so as to contact with the anode electrode 12. The field plate electrode 8 consisting of Ni/Au is formed on the insulating film 7. The field plate electrode 8 is electrically connected with the anode electrode 12. In addition a cathode electrode (K: first electrode) 13 consisting of Ti/Al/Ni/Au is formed on the barrier layer 2 in a state of separating from the above anode electrode 12.

In the SBD of the sixth embodiment, the n-AlGaN/GaN hetero-structure including the barrier layer 2 and the channel layer 1 is employed like the HEMT described before. By doing so, it is possible to realize high breakdown voltage and ultra-low ON resistance.

The semiconductor layer 3 including the p-AlGaN layer is formed on the barrier layer 2 including the n-AlGaN layer. By doing so, holes are securely discharged when avalanche breakdown occurs; therefore, high voltage effect can be expected. The semiconductor layer 3 is formed in the above manner, and thereby, it is possible to reduce a Schottky junction area directly contacting the anode electrode 12 with barrier layer, and to reduce a reverse leakage current.

Seventh Embodiment

Figure 15:
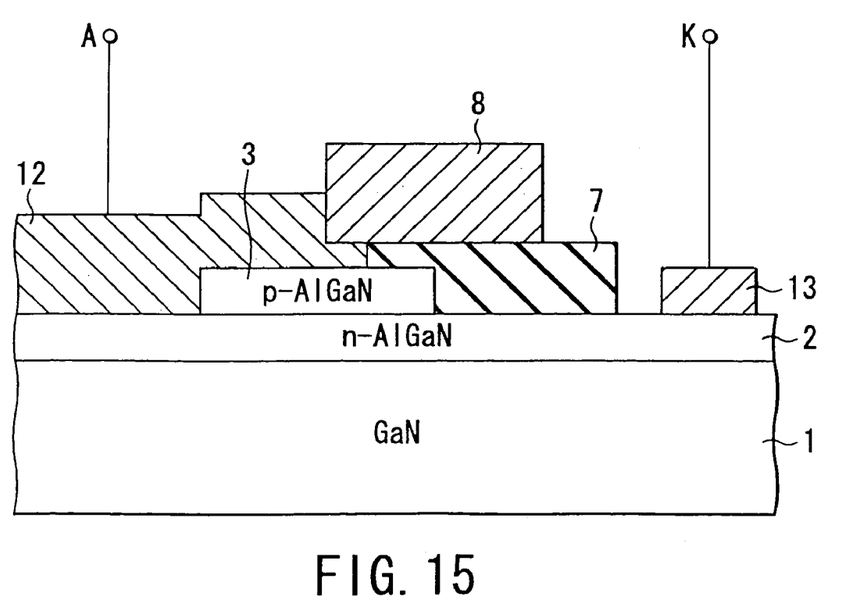
FIG. 15 is a cross-sectional view schematically showing a power semiconductor device according to a seventh embodiment of the present invention.

FIG. 15 is a cross-sectional view schematically showing the structure of a Schottky barrier diode (SBD) according to a seventh embodiment of the present invention.

In the SBD of the seventh embodiment, the semiconductor layer 3 is formed at the Schottky junction end. In this case, the end of the semiconductor layer 3 on the side of the cathode electrode 13 is positioned between the end of the field plate electrode 8 on the side of the cathode electrode 13 and the end of the anode electrode 12 on the side of the cathode electrode 13.

Figure 16A:
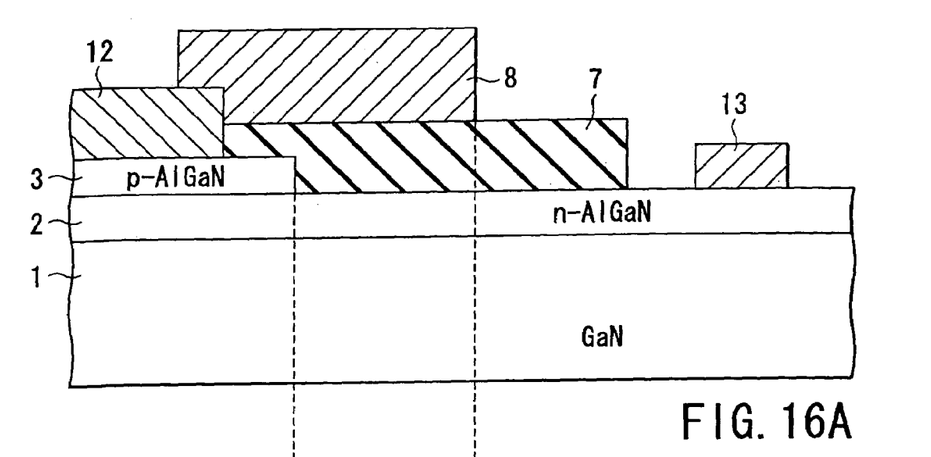
FIG. 16A and FIG. 16B are a cross-sectional view and a characteristic diagram respectively to explain the above seventh embodiment.
Figure 16B:
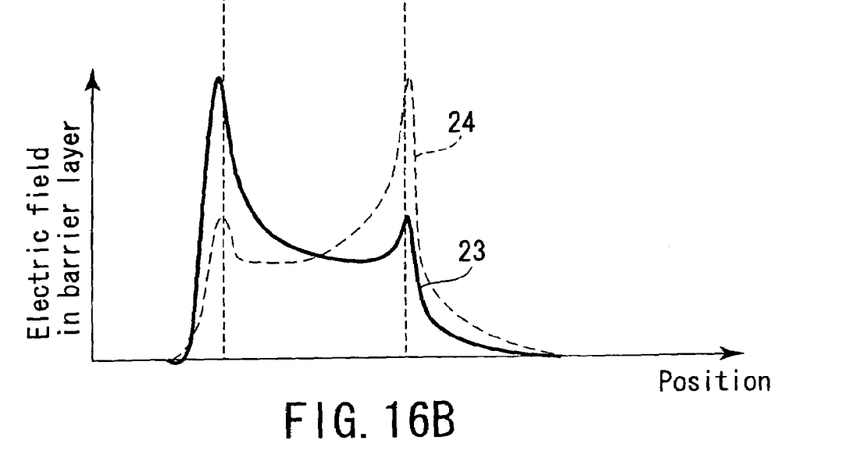

FIG. 16A and are a cross-sectional view enlarging the end of the semiconductor layer 3 shown in FIG. 15, and FIG. 16B is a characteristic diagram showing an electric field distribution in the barrier layer 2 when the SBD of FIG. 15 is operated.

As shown in FIG. 15, the semiconductor layer 3 is formed so that the end portion on the side of the cathode electrode 13 can be positioned below the filed plate electrode 8. By doing so, the field concentrated points exists at the end of the semiconductor layer 3 and at the end of the field plate electrode 8, as seen from FIG. 16B. In FIG. 16B, the characteristic curve 23 shows the case where the insulating film 7 is formed thick in some degree; on the other hand, the characteristic curve 24 shows the case where the insulating film 7 is formed thin in some degree.

More specifically, in the SBD, the thickness t of the insulating film 7 is set so that the above relative equations (5) and (7) can be satisfied, as described in the HEMT of the above second embodiment. By doing so, it is possible to secure avalanche withstand capability, and to avoid the dielectric breakdown.

The present invention has been described based on the first to seventh embodiments. Incidentally, the present invention is not limited to the above embodiments, and besides, modifications readily imaged by skilled persons in the art are all applicable.

For instance, it is desirable that the semiconductor layer 3 including the p-AlGaN layer used for discharging holes has the band gap narrower than that of the barrier layer 2 including the n-AlGaN layer in the light of holes discharge. Namely, it is desirable that the composition ratio of Al is small, and p-GaN layer may be used. In order to reduce the contact resistance with respect to the semiconductor layer 3, a semiconductor layer such as an InGaN layer having a narrow band gap is used as a contact layer. The contact layer may be formed between the gate electrode 6 or anode electrode 12 and the semiconductor layer 3.

In the above embodiments, the combination of AlGaN/GaN has been employed as the device material. In this case, the combination of GaN/InGaN or AlN/AlGaN may be employed.

The present invention is not limited to unipolar devices such as junction type FET. In this case, the present invention is readily applicable to bipolar devices such as pin diodes and IGBTs provided with a p-layer on the drain side of MISFET so long as the device is a lateral type.

As is evident from the above description, according to the present invention, it is possible to obtain a lateral type GaN-based power device, which has high avalanche withstand capability, high breakdown voltage and ultra-low ON resistance.

What is claimed is:

1. A power semiconductor device comprising:
   a first semiconductor layer of non-doped $Al_XGa_{1-X}N$ ($0 \leq X \leq 1$);
   a second semiconductor layer of non-doped or n-type $Al_YGa_{1-Y}N$ ($0 \leq Y \leq 1$, X<Y) formed on one surface of the first semiconductor layer;
   a third semiconductor layer of p-type $Al_ZGa_{1-Z}N$ ($0 \leq Z \leq 1$) selectively formed on the second semiconductor layer;
   a first electrode positioned at one of both sides of the third semiconductor layer, and formed on the second semiconductor layer;
   an insulating film formed on the second semiconductor layer adjacent to the third semiconductor layer between at least third semiconductor layer and the first electrode; and
   a field plate electrode formed on the insulating film.

2. A power semiconductor device according to claim 1, further including:
   a second electrode positioned at the other of both sides of the third semiconductor layer, and formed on the second semiconductor layer; and
   a control electrode formed on the third semiconductor layer, the field plate electrode being electrically connected with the control electrode or the second electrode.

3. A power semiconductor device according to claim 2, wherein the end of the third semiconductor layer on the first electrode side is positioned between the end of the control electrode on the first electrode side and the end of field plate electrode on the first electrode side.

4. A power semiconductor device according to claim 2, wherein when a thickness of the insulating film positioned below the field plate electrode set as t, dielectric constant of the insulating film is set as $\epsilon_i$, dielectric constant of the second semiconductor layer is set as $\epsilon_S$, and a distance between the end of the third semiconductor layer on the first electrode side and the end of the control electrode on the first electrode side is set as L, the thickness t of the insulating layer is set so as to satisfy the following relationship $$\epsilon_S t > \epsilon_i L.$$

5. A power semiconductor device according to claim 2, wherein when a thickness of the insulating film positioned below the field plate electrode set as t, dielectric constant of the insulating film is set as t, dielectric constant of the second semiconductor layer is set as $\epsilon_S$, and a distance between the end of the third semiconductor layer on the first electrode side and the end of the control electrode on the first electrode side is set as L, the thickness t of the insulating layer is set so as to satisfy the following relationship $$2t/L > (1 + \epsilon_i/\epsilon_S).$$

6. A power semiconductor device according to claim 2, wherein the interval between the first electrode and the control electrode is wider than the interval between the second electrode and the control electrode.

7. A power semiconductor device according to claim 2, further including:
a gate insulating film formed between the control electrode and the third semiconductor layer.

8. A power semiconductor device according to claim 7, wherein the second electrode is electrically connected with the third semiconductor layer.

9. A power semiconductor device according to claim 8, wherein the third semiconductor layer is formed a shape of rectangle in a direction vertical to the first and second electrodes arranged in parallel.

10. A power semiconductor device according to claim 2, further including:
a fourth semiconductor layer of p-type $Al_W Ga_{1-W}N$ ($0 \leq W \leq 1$, $W \leq X$) formed on the other surface of the first semiconductor layer, said fourth semiconductor being electrically connected with the second electrode.

11. A power semiconductor device according to claim 10, wherein a thickness of the first semiconductor layer is smaller than the interval between the control electrode and the first electrode.

12. A power semiconductor device comprising:
a first semiconductor layer of non-doped $Al_X Ga_{1-X}N$ ($0 \leq X \leq 1$);
a second semiconductor layer of non-doped or n-type $Al_Y Ga_{1-Y}N$ ($0 \leq Y \leq 1$, $X < Y$) formed on the first semiconductor layer;
a third semiconductor layer of p-type $Al_Z Ga_{1-Z}N$ ($0 \leq Z \leq 1$) selectively formed on the second semiconductor layer;
an insulating film formed on the second semiconductor layer;
a field plate electrode formed on the insulating film;
a first electrode formed on the second semiconductor layer; and
a second electrode formed on the third semiconductor layer.

13. A power semiconductor device according to claim 12, wherein the second electrode is electrically connected with the second semiconductor layer.

14. A power semiconductor device according to claim 12, wherein the second electrode is electrically connected with the field plate electrode.

15. A power semiconductor device according to claim 12, wherein the end of the third semiconductor layer on the first electrode side is positioned between the end of the field plate electrode on the first electrode side and the end of the second electrode on the first electrode side.

16. A power semiconductor device according to claim 12, wherein when a thickness of the insulating film positioned below the field plate electrode set as t, dielectric constant of the insulating film is set as $\epsilon_i$, dielectric constant of the second semiconductor layer is set as $\epsilon_S$, and a distance between the end of the third semiconductor layer on the first electrode side and the end of the control electrode on the first electrode side is set as L, the thickness t of the insulating layer is set so as to satisfy the following relationship $$\epsilon_S t > \epsilon_i L.$$

17. A power semiconductor device according to claim 12, wherein when a thickness of the insulating film positioned below the field plate electrode set as t, dielectric constant of the insulating film is set as $\epsilon_i$, dielectric constant of the second semiconductor layer is set as $\epsilon_S$, and a distance between the end of the third semiconductor layer on the first electrode side and the end of the control electrode on the first electrode side is set as L, the thickness t of the insulating layer is set so as to satisfy the following relationship $$2t/L > (1 + \epsilon_i/\epsilon_S).$$

* * * * *